(12) United States Patent
Saito

(10) Patent No.: US 6,433,414 B2
(45) Date of Patent: Aug. 13, 2002

(54) METHOD OF MANUFACTURING FLEXIBLE WIRING BOARD

(75) Inventor: Hirokazu Saito, Ome (JP)

(73) Assignees: Casio Computer Co., Ltd.; Casio Micronics Co., Ltd., both of Tokyo (JP)

( * ) Notice: Subject to any disclaimer, the term of this patent is extended or adjusted under 35 U.S.C. 154(b) by 0 days.

(21) Appl. No.: 09/766,269

(22) Filed: Jan. 19, 2001

(30) Foreign Application Priority Data

Jan. 26, 2000 (JP) .......................................... 2000-016491
Jan. 26, 2000 (JP) .......................................... 2000-016492
Dec. 7, 2000 (JP) .......................................... 2000-372946

(51) Int. Cl.[7] ................................................ H01L 23/06

(52) U.S. Cl. ...................................... 257/684; 257/679

(58) Field of Search ................................ 257/684, 679; 345/206, 87, 149; 29/832; 361/751

(56) References Cited

U.S. PATENT DOCUMENTS

| | | | | |
|---|---|---|---|---|
| 5,592,199 A | * | 1/1997 | Kawaguchi et al. | 345/206 |
| 5,777,610 A | * | 7/1998 | Sugimoto et al. | 345/206 |
| 5,822,191 A | * | 10/1998 | Tagusa et al. | 361/751 |
| 6,052,171 A | * | 4/2000 | Kawaguchi | 349/149 |
| 6,223,429 B1 | * | 5/2001 | Kaneda et al. | 29/832 |
| 6,291,877 B1 | * | 9/2001 | Usami et al. | 257/679 |

* cited by examiner

*Primary Examiner*—Hoai V. Ho
*Assistant Examiner*—Thinh Nguyen
(74) *Attorney, Agent, or Firm*—Frishauf, Holtz, Goodman & Chick, P.C.

(57) ABSTRACT

A flexible wiring board is provided which is made of a relatively thin polyimide film and, thus, can be bent easily. Therefore, the flexible wiring board can be bent easily in the vicinity of a semiconductor chip mounting region without forming slits for facilitating the bending in the film substrate. As a result, it is possible to decrease the length of that portion of the flexible wiring board which is positioned ahead of the semiconductor chip mounting region.

7 Claims, 12 Drawing Sheets

METHOD OF MANUFACTURING FLEXIBLE WIRING BOARD

CROSS-REFERENCE TO RELATED APPLICATIONS

This application is based upon and claims the benefit of priority from the prior Japanese Patent Applications No. 2000-016491, filed Jan. 26, 2000; No. 2000-016492, filed Jan. 26, 2000; and No. 2000-372946, filed Dec. 7, 2000, the entire contents of which are incorporated herein by reference.

BACKGROUND OF THE INVENTION

The present invention relates to a flexible wiring board, a method of manufacturing a flexible wiring board, and a display device such as a liquid crystal panel for a liquid crystal display module connected to a flexible wiring board.

FIGS. 12 to 14 collectively show an example of a conventional liquid crystal display module. As shown in the figures, the conventional liquid crystal display module comprises a liquid crystal display panel 1 and a flexible wiring board 11. The liquid crystal panel 1 is prepared by bonding a segment substrate 2 and a common substrate 3 to each other with a substantially frame-like seal member 5 interposed therebetween and by sealing a liquid crystal 7 between these substrates 2 and 3 positioned inside the seal member 5. Segment electrodes 2a and a common electrode 3a are mounted to those surfaces of the substrates 2 and 3, respectively, which are positioned to face each other so as to permit a predetermined voltage to be applied to the liquid crystal 7. The lower side portion in FIG. 12 of the segment substrate 2 protrudes from the lower side of the common substrate 3 to form a protruding portion 2b. A plurality of connection terminals 4 including segment terminals connected to the segment electrodes 2a and common terminals connected to the common electrode 3a via the seal member 5 are arranged in parallel on one surface of the protruding portion 2b.

The flexible wiring board 11 comprises an oblong film substrate 12 on which electronic parts are mounted by a TAB (tape automated bonding) system. The film substrate 12, which is about 75 μm to 150 μm thick, is formed of, for example, a polyimide film. A semiconductor chip 13 for driving the liquid crystal display panel 1 such as an LSI and chip parts 14 required for driving the liquid crystal display panel 1 and each comprising a capacitor, a resistor, etc. are mounted on predetermined positions in substantially the central portion of the film substrate 12. In this case, the semiconductor chip 13 is mounted on a region the film substrate 12, in which a device hole 15 is formed.

A large number of output wirings 16 are connected to the semiconductor chip 13 on the upper surface of the film substrate 12 in an upper region in FIG. 12 of the mounting region of the semiconductor chip 13, and a large number of input wirings 17 extending in parallel are connected to the semiconductor chip 13 and the chip parts 14 in the lower portion in FIG. 12 of the mounting region of the semiconductor chip 13. The lower end portion in FIG. 12 of each input wiring 17 constitutes a first connection terminal 17a, with that portion of each input wiring 17 which protrudes into the device hole 15 constituting a second connection terminal 17b.

The output wiring 16 will now be described. It should be noted that two slits 18 and 19 extending in parallel in a lateral direction are formed in the film substrate 12 in predetermined two positions in an upper portion in FIG. 12 of the mounting region of the semiconductor chip 13. The roles played by these two slits 18, 19 will be described herein later. The output wirings 16 comprise a plurality of first connection terminals 16a formed in parallel in an upper end portion of the film substrate 12, a plurality of second connection terminals 16b protruding into the device hole 15 in a portion of the device hole 15, first drawing wire sections 16c formed in parallel in the portions of these slits 18, 19 and between these slits 18 and 19, and second drawing wire sections 16d arranged between the first drawing wire sections 16c and the second connection terminals 16b such that the pitch of these second drawing wire sections 16d is gradually increased from the second connection terminals 16b toward the first drawing wire sections 16c. A protective film 10 made of a solder resist is formed on the upper surface of the film substrate 12 including the wirings 16 and 17 except the mounting region of the semiconductor chip 13, the mounting region of the chip parts 14, the upper end portion in FIG. 12 including the first connection terminals 16a and the lower end portion including the second connection terminals 17a. The protective film 10 is provided with slits 10a and 10b in positions corresponding to the slits 18 and 19, respectively, of the film substrate 12.

The bonding portions comprising the portions of the first connection terminals 16a of the flexible substrate 11 are bonded to the bonding portions comprising the connection terminals 4 of the liquid crystal display panel 1 with an anisotropic conductive adhesive (not shown) interposed therebetween.

The reason for forming the device hole 15 in the film substrate 12 will now be described. First the mounting state of the semiconductor 13 will be described. A plating layer (not shown) made of a metal having a low melting point such as tin or a solder is formed on the surfaces of the output wirings 16 and the input wirings 17. As shown in FIG. 13, the upper surfaces of a plurality of bump electrodes 6 made of gold and formed in a peripheral portion on one surface of the semiconductor chip 13 are bonded to the upper surfaces of the second connection terminals 16b, 17b by a eutectic alloy of gold-tin or gold-solder so as to bond the semiconductor chip 13 to the portion surrounding the device hole 15 of the film substrate 12.

When the bump electrodes 6 of the semiconductor chip 13 are bonded to the connection terminals 16b, 17b by a eutectic alloy, the semiconductor chip 13 is disposed on a stage (not shown), and then the film substrate 12 is moved to a region above the semiconductor chip 13 so as to align the positions of the connection terminals 16b, 17b of the film substrate 12 with the positions of the bump electrodes 6 of the semiconductor chip 13. Further, a bonding tool is brought into direct contact with the connection terminals 16b, 17b for the pressurizing under heat. For the operation described above, the device hole 15 is formed in the film substrate 12. The reason for forming the device hole 15 is as follows. Since the film substrate 12 is relatively thick, i.e., the thickness is about 75 μm to 150 μm, the film substrate 12 is unfavorably melted before the bump electrodes 6 and the connecting terminals 16b, 17b are heated to reach the bonding temperature, when the film substrate 12 is pressurized directly from above by the bonding tool at 530 to 550° C. without forming the device hole 15. As a result, a defective bonding is generated by the deviation in the position of the wiring.

An example of mounting the liquid crystal display module shown in FIG. 12 to a circuit board will now be described with reference to FIG. 14. The liquid crystal display panel 1 is disposed in a predetermined position on the upper surface of a circuit board 21 with the segment substrate 2 being positioned on the lower side. The flexible wiring board 11 is bent at substantially 90° in each of the portions of the slit 18(10a) and 19(10b). The portion between the slits 18 and 19 of the flexible wiring board 11 is inserted into a slit 22 formed in a predetermined position of the circuit board 21, and the portion below the circuit board 21 is allowed to extend along the lower surface of the circuit board 21. Under this state, the bonding portions comprising the second connection terminals 17a of the flexible wiring board 11 are bonded to bonding portions comprising the connection terminals formed at predetermined positions on the lower surface of the circuit board 21 with an anisotropic conductive adhesive (not shown) interposed therebetween so as to communicate with an electronic part 9 via a wiring 8.

The roles played by the slits 18(10a) and 19(10b) will now be described. It should be noted that the film substrate 12 of the conventional flexible wiring board 11 is relatively thick, i.e., about 75 µm thick. Also, the flexible wiring board 11 is bent when the display module is housed in a package. If the slits 18 and 19 are not formed, it is difficult to bend the flexible wiring board 11 as desired. Therefore, the slits 18 and 19 are formed so as to facilitate the bending of the flexible wiring board 11. Also, if the slit is formed in the arranging region of the second drawing wiring sections 16d, the second drawing wiring sections 16d are put in an inclined state toward the longitudinal direction, i.e., in the vertical direction in FIG. 12, of the film substrate 12. As a result, the length of each second drawing wiring section 16d corresponding to the slit is made larger than the length in lateral direction of the slit. In addition, the presence of the slit causes the second drawing wiring section 16d not to be supported by the film substrate 12 and, thus, to be irregularly twisted, giving rise to the occurrence of a short circuit. Such being the situation, a slit is not formed in the arranging region of the inclined second drawing wiring sections 16d, and the first drawing wiring sections 16c are arranged in parallel in the portions of the slits 18, 19 and between the slits 18 and 19.

As described above, in the conventional flexible wiring board 11, the first drawing wiring sections 16c are arranged in parallel in the portions of the slits 18, 19 and between the slits 18 and 19, with the result that the length in the vertical direction of the upper portion in FIG. 12 of the mounting region of the semiconductor chip 13 is rendered larger, leading to an increase in the entire length in the vertical direction. It follows that a first problem is generated that the flexible wiring board 11 is rendered bulky so as to increase the manufacturing cost.

What should also be noted is that, in the conventional semiconductor device, the inner leads 16b, 17b protrude into the device hole 15 of the film substrate 12. The protruding inner leads 16b and 17b tend to be deformed so as to bring about a short circuit between these inner leads 16b and 17b. Particularly, the pitch of the bump electrodes 6 is being made smaller and smaller in recent years in accordance with increase in the degree of integration of the semiconductor chip 13. As a result, the width of and the distance between the inner leads 16b and 17b are being diminished so as to cause the inner leads 16b, 17b to be highly likely to be deformed. A second important problem to be solved is how to cope with the defective bonding and occurrence of short circuit caused by the deformation.

BRIEF SUMMARY OF THE INVENTION

A first object of the present invention is to solve the first problem given above so as to miniaturize the flexible wiring board that can be connected satisfactorily to an external circuit.

A second object of the present invention is to solve the second problem given above so as to prevent the connection terminal mounted to the film substrate from being deformed, thereby improving the reliability of the bonding with the bump electrode of the semiconductor chip.

For achieving the first object described above, there is provided a flexible wiring board in which the inclined wiring sections of a plurality of drawing wirings are rendered capable of being bent freely, and the inclined wiring region of the film having the inclined wiring sections mounted thereon are also rendered capable of being bent freely. As a result, it is unnecessary to arrange the wirings and the film covering the length of a plurality of slits for the bending and also covering the length of the parallel wiring section between these slits, which were formed in the past in the region other than the inclined wiring section, so as to achieve miniaturization of the flexible wiring board.

In order to achieve the bending degree that does not cause the wiring to be peeled off with a small stress, it is desirable for the film to have a thickness not smaller than 10 µm and smaller than 40 µm In order to achieve the second object described above, a semiconductor chip is bonded to a film substrate by heating the surface of the semiconductor chip other than the surface on which a plurality of bump electrodes are mounted and by also heating the surface of the flexible wiring board other than the surface on which a plurality of connection terminals are mounted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
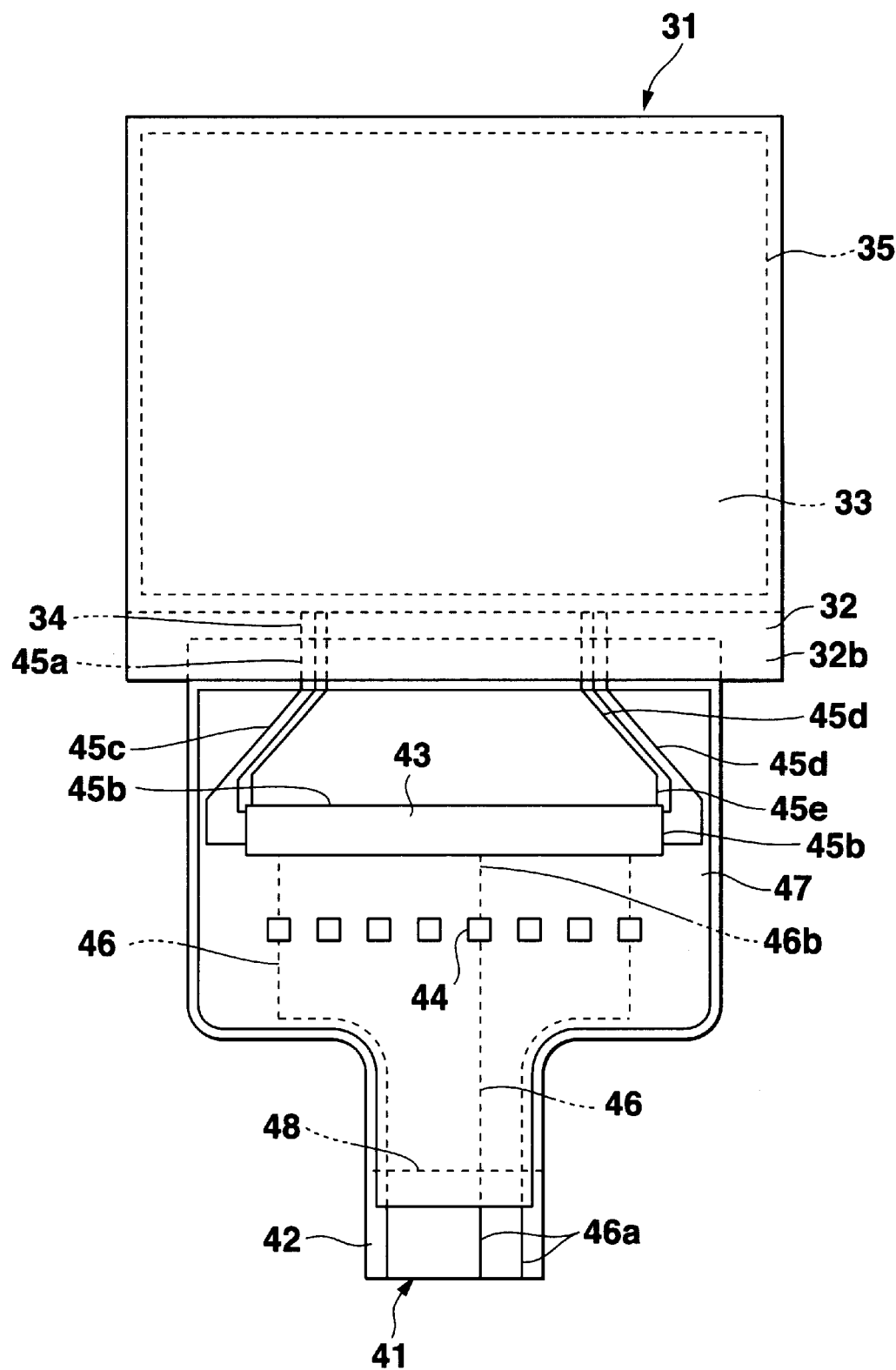
FIG. 1 is a plan view showing a liquid crystal display module according to a first embodiment of the present invention.
Figure 4:
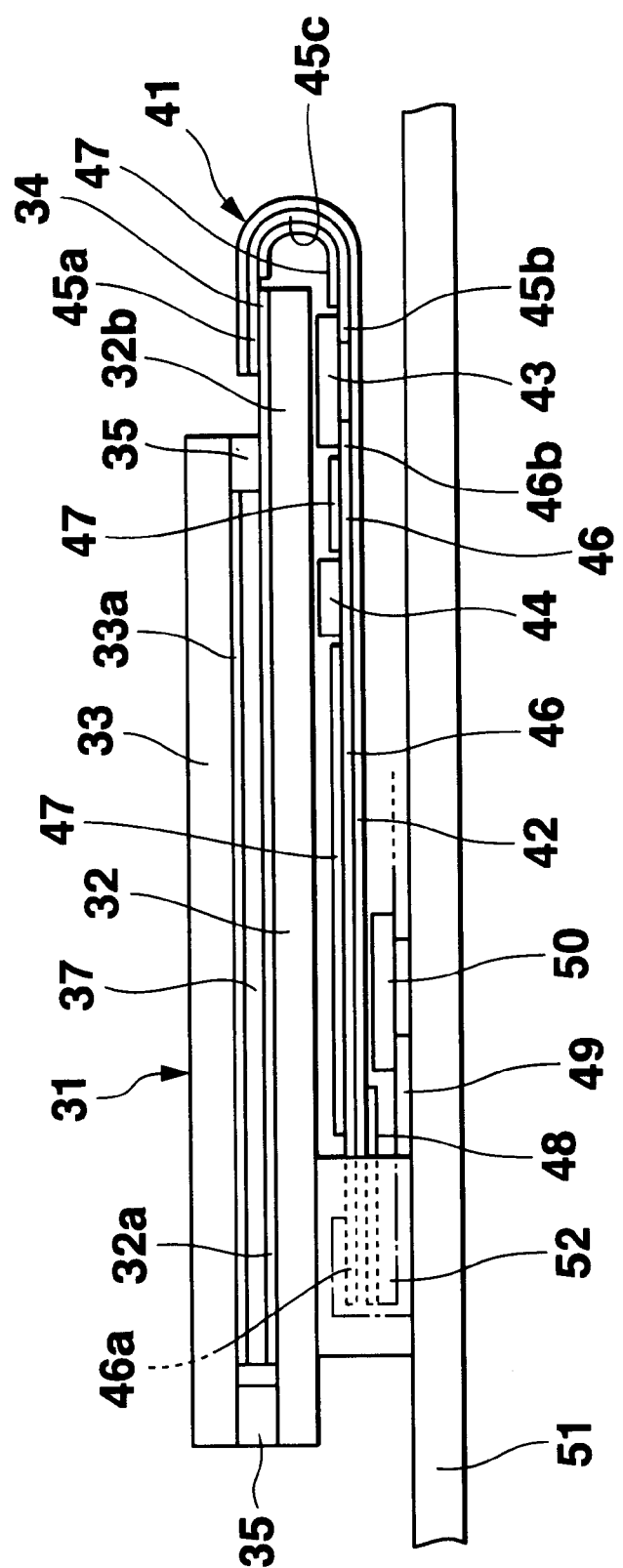
FIG. 4 is a view for exemplifying the state that the liquid crystal display module shown in FIG. 1 is mounted to a circuit board.

FIGS. 1 and 4 collectively show a liquid crystal display module according to a first embodiment of the present invention. As shown in the drawings, the liquid crystal display module in this embodiment comprises a liquid crystal display panel 31 and a flexible wiring board 41. The liquid crystal display panel 31 includes a segment substrate 32, a common substrate 33, a substantially frame-like seal member 35 arranged between these substrates 32 and 33 and serving to bond these two substrates 32 and 33 with a predetermined clearance provided therebetween, and a liquid crystal material 37 sealed in the clearance between the segment substrate 32 and the common substrate 33 and inside the seal member 35. A plurality of segment electrodes 32a and a common electrode 33a are mounted to those surfaces of the substrates 32 and 33 which are positioned to face each other so as to permit a predetermined voltage to be applied to the liquid crystal material 37. A lower side portion 32b in FIG. 1 of the segment substrate 32 protrudes from the lower side of the common substrate 33 to form a protruding portion 32b. A plurality of connection terminals 34 comprising the segment terminals connected to the segment electrodes 32a and common terminals connected to the common electrode 33a via the seal member 35 are arranged in parallel on one surface of the protruding portion 32b.

The flexible wiring board 41 has a construction that it is possible to mount electronic parts such as a semiconductor chip 43 and chip parts 44 to a film substrate 42 of a predetermined shape by a COF (Chip On Film) system, or any or all of the electronic parts noted above are mounted to the film substrate 42. The film substrate 42 is constructed by a polyimide film having a thickness not smaller than 10 μm and smaller than 40 μm, preferably between 25 μm and 38 μm, and a wiring formed on one surface of the polyimide film, i.e., a wiring supported by the polyimide film. As described herein later, the wiring comprises a plurality of output wirings 45 and a plurality of input wirings 46 shown in FIG. 3 and is formed directly on the polyimide film without using an interposing insulating material such as an adhesive. To be more specific, a copper layer is formed on the polyimide film in a thickness of several thousand angstroms by means of an electroless plating or a sputtering, followed by applying an electrolytic plating of copper for forming the wiring without using an interposing layer as described above. A metal having a low melting point such as tin or solder is plated on the surface of the wiring. The semiconductor chip 43 for driving the liquid crystal display panel 31, such as an LSI, and the chip parts 44 required for driving the liquid crystal display panel 31 and including a capacitor, a resistor, etc. are mounted in predetermined portions in the substantially central portion of the film substrate 42. Since a COF system may be employed for mounting the electronic parts onto the film substrate 42, any device hole is not formed in the mounting region of the semiconductor chip 43. How to mount the semiconductor chip 43 will be described herein later.

On the upper surface of the film substrate 42, the output wiring 45 is connected to the semiconductor chip 43 in an upper region in FIG. 1 of the mounting region of the semiconductor chip. On the other hand, the input wiring 46 is connected to the semiconductor chip 43 and the chip parts 44 in a lower region in FIG. 1. A thin protective film 47 made of a solder resist covers the upper surface of the film substrate 42 including the output wiring 45 and the input wiring 46 except the mounting region of the semiconductor chip, the mounting region of the chip part, and the upper end and lower end portions in FIG. 1.

Figure 2:
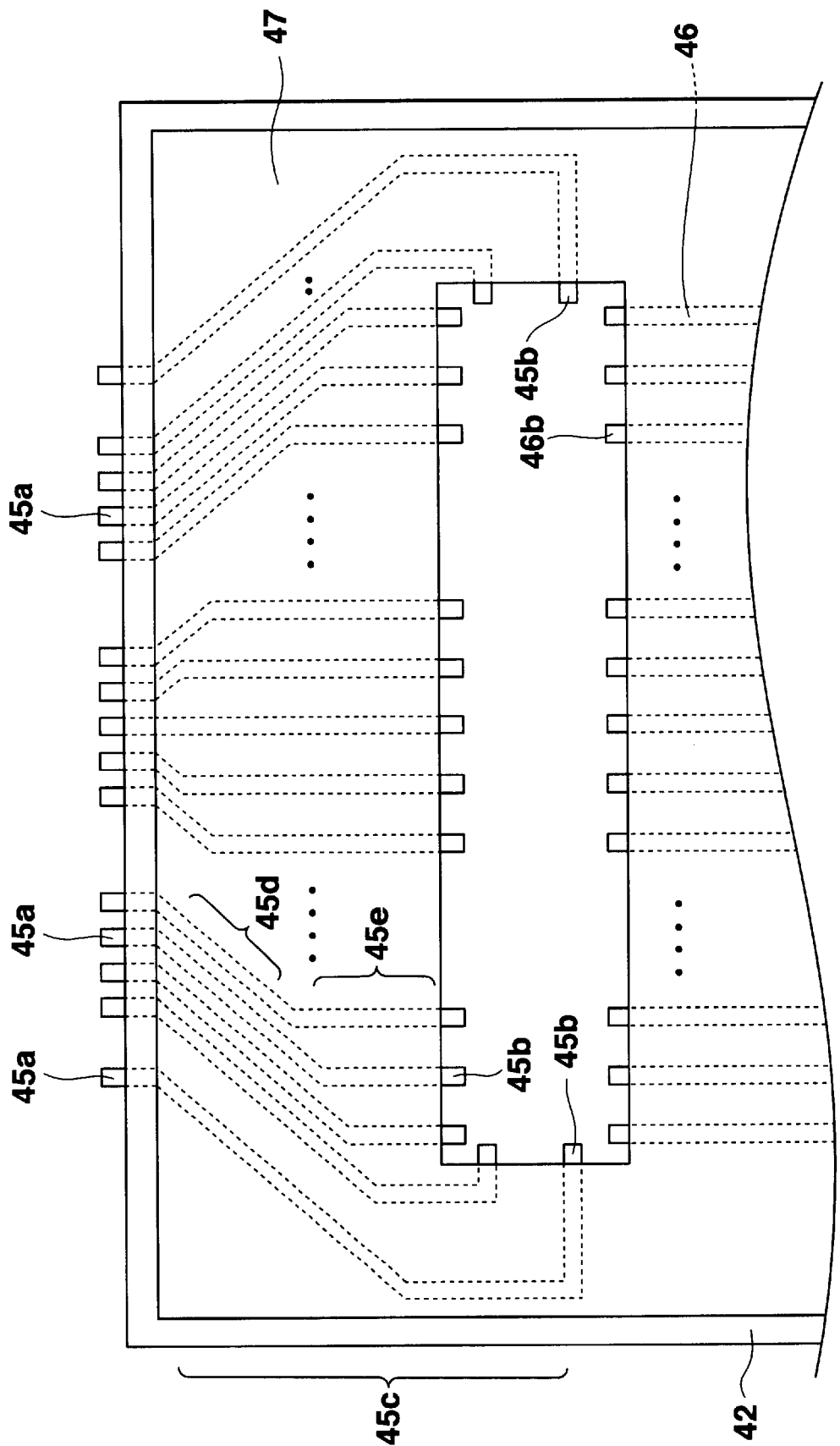
FIG. 2 is a plan view showing a wiring structure of a flexible wiring board of the liquid crystal display module shown in FIG. 1.

The output wiring 45 comprises a plurality of first connection terminals 45a that are not covered with the protective film 47 so as to be exposed to the upper end portion in FIG. 1, a plurality of second connection terminals 45b arranged in parallel in predetermined positions in the mounting region of the semiconductor chip and in the vicinity of said predetermined positions, and a plurality of drawing wires 45c formed between the first and the second connection terminals 45a, 45b. As shown in FIG. 2, the drawing wire 45c comprises inclined wiring sections 45d positioned on the side of the first connection terminals 45a and arranged in an inclined fashion in a plurality of directions and parallel wiring sections 45e positioned on the side of the second connection terminals 45b and arranged parallel to each other.

In the flexible wiring board 41, the second connection terminals 46b of the input wiring 46 are arranged at positions facing bump electrodes on one in a longitudinal direction of the rectangular semiconductor chip 43, and the second connection terminals 45b of the output wiring 45 are arranged at positions facing the bump electrodes on the other three sides of the rectangular semiconductor chip 43. It follows that, since the number of the first connection terminals 45a arranged in a concentrated fashion on one side of the film substrate 42 corresponds to the number of bump electrodes on the other three sides of the semiconductor chip 43, the distance between the adjacent first connection terminals 45a is required to be shorter than the distance between the adjacent second connection terminals 45b.

Such being the situation, the inclined wiring sections 45d are inclined so as to be concentrated in a central portion of one side on the side of the first connection terminals 45a in the flexible wiring board 41, thereby permitting the distance between adjacent first connection terminals 45a to be made smaller. In addition, the inclined wiring sections 45d are constructed such that (1) the pitches between the inclined wiring sections 45d of the adjacent drawing wiring sections 45c, i.e., the length of the width of one drawing wiring section 45c and the sum of the shortest distances between adjacent drawing wiring sections 45c, are equal to each other and the pitches are constant in the direction of the length of the inclined wiring sections 45d, or (2) the distances of the lines positioned on a straight line in a predetermined direction and joining the adjacent drawing wiring sections 45c are equal to each other, and even if the straight line in a predetermined direction is slid in the longitudinal direction of the inclined wiring sections 45d, the length of the line is rendered constant. It follows that the inclined wiring section 45d is made shorter if positioned closer to the center of one side of the film substrate 42 and is made longer if positioned closer to both ends of one side of the film substrate 42.

A plurality of parallel wiring section 45e are positioned closer to the second connection terminals 45b than the inclined wiring sections 45d and the length of each parallel wiring section 45e is determined in accordance with, for example, the length of the inclined wiring section 45d and the position of the second connection terminal 45b.

In the liquid crystal module of the wiring structure described above, the inclined wiring sections 45d and the parallel wiring sections 45e may be readily bent so as to permit the flexible wiring board 41 to be moderately bent in a U-shape together with the film substrate 42 as shown in FIG. 4. As a result, the physical stress applied to the wiring is not concentrated on a single point but is dispersed so as to produce the effect that the breakage of the wiring is unlikely to take place.

It should be noted that the shortest distance between the adjacent first connection terminals 45a is shorter than the shortest distance between the adjacent second connection terminals 45b, with the result that the shortest distance between the adjacent inclined wiring sections 45d on the side of the first connection terminals 45a is unavoidably made shorter than the shortest distance between the adjacent parallel wiring sections 45e. It follows that it is desirable for the width of each inclined wiring section 45d to be shorter than the width of each parallel wiring section 45e. The inclined wiring section 45d of such a fine structure tends to be bent more easily. In the conventional structure, the thickness of the film substrate 42 is increased, and a slit is formed below the inclined wiring section 45d so as to locally bend the structure. In the conventional structure, however, the wire breakage tends to take place easily. The technical idea of the present invention may produce a prominent effect in particularly the case of such a wiring structure.

If the inclined wiring section 45d is independently capable of connecting the first connection terminal 45a and the second connection terminal 45b under the conditions (1) and (2) described above, it is not absolutely necessary to use the parallel wiring section 45e.

A reinforcing plate 48 is bonded with an adhesive (not shown) to the lower surface of the film substrate 42 to cover the region corresponding to the arranging region of the connection terminals 46a and region in the vicinity of the region noted above. The reinforcing plate 48, which is formed of, for example, polyethylene terephthalate, has a thickness of about 50 to 70 m.

The connection terminals 46a communicate with an electronic part 50 via a wiring 49.

Figure 3:
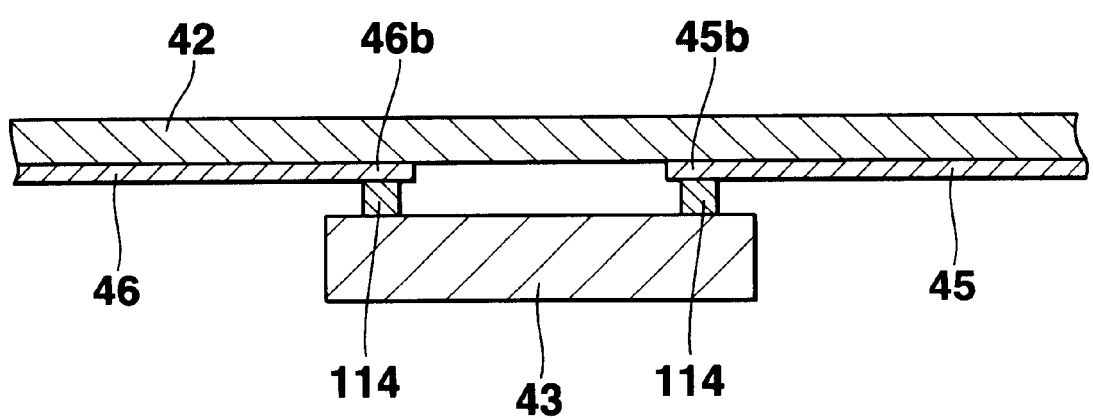
FIG. 3 is a cross sectional view showing a portion a flexible wiring board having a semiconductor chip mounted thereto.

As shown in FIG. 3, bump electrodes 114 each made of gold are mounted on the peripheral portions of the upper surface of the semiconductor chip 43. These bump electrodes 114 are bonded to the lower surfaces of the connection terminals 45b and 46b of the film substrate 42 by using a eutectic alloy, with the result that the semiconductor chip 43 is mounted on a predetermined portion of the lower surface of the film substrate 42.

The bonding portion constructed by the first connection terminal 45a of the flexible wiring board 41 is bonded to the bonding portion constructed by the connection terminal 34 of the liquid crystal display panel 31 via an anisotropic conductive adhesive (not shown).

How to mount the liquid crystal display module shown in FIG. 1 onto a circuit board will now be described with reference to FIG. 4. As shown in the figure, the liquid crystal display panel 31 is mounted on a predetermined position of a circuit board 51 with the segment substrate 32 of the liquid crystal display panel 31 positioned on the lower side. As described herein later, the flexible wiring board 41 is bent substantially in a U-shape in the arranging region of the drawing wirings 45c shown in FIG. 1. The term "bending" noted above differs from the local bending achieved by the conventional molding and implies that the flexible wiring board is moderately bent by its own flexibility without relying on the molding. It should be noted that a portion of the flexible wiring board 41 under the liquid crystal display panel 31 is allowed to extend along the upper surface of the circuit board 51. Under this state, the connector portions formed by the portions of the first connection terminals 46a of the flexible wiring board 41 is inserted into a female connector 52 formed in a predetermined position on the upper surface of the circuit board 51.

Figure 12:
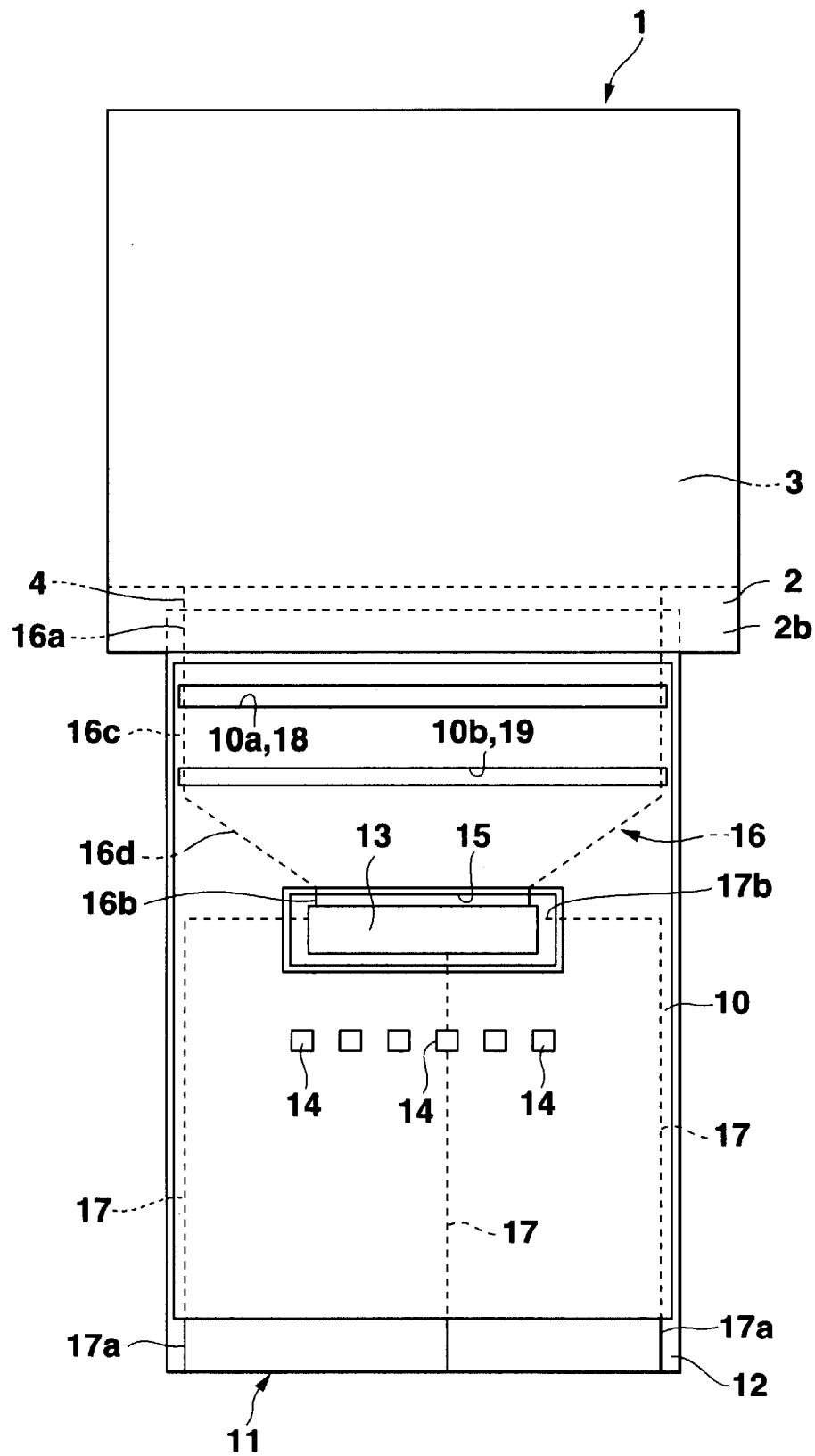
FIG. 12 is a plan view exemplifying a conventional liquid crystal display module.
Figure 13:
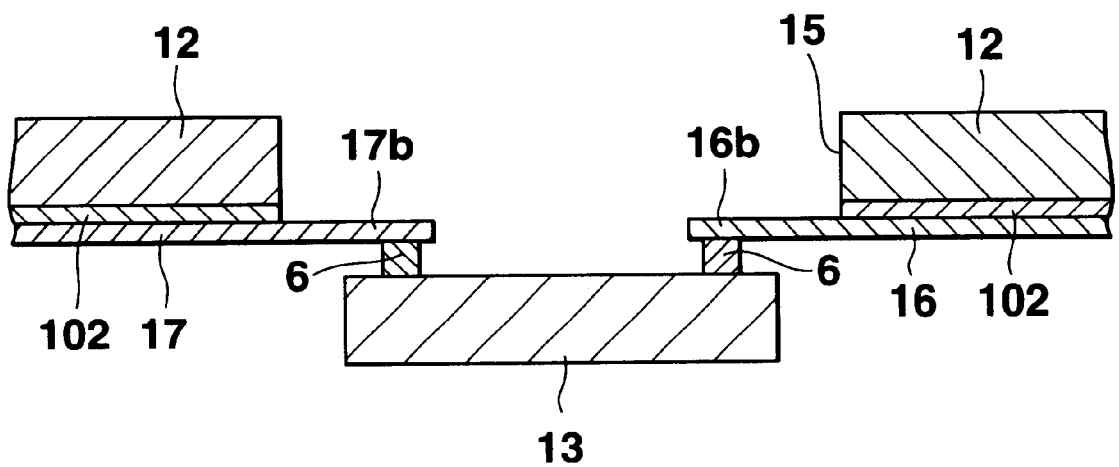
FIG. 13 is a cross sectional view showing a connection structure between a conventional flexible wiring board and a semiconductor chip.
Figure 14:
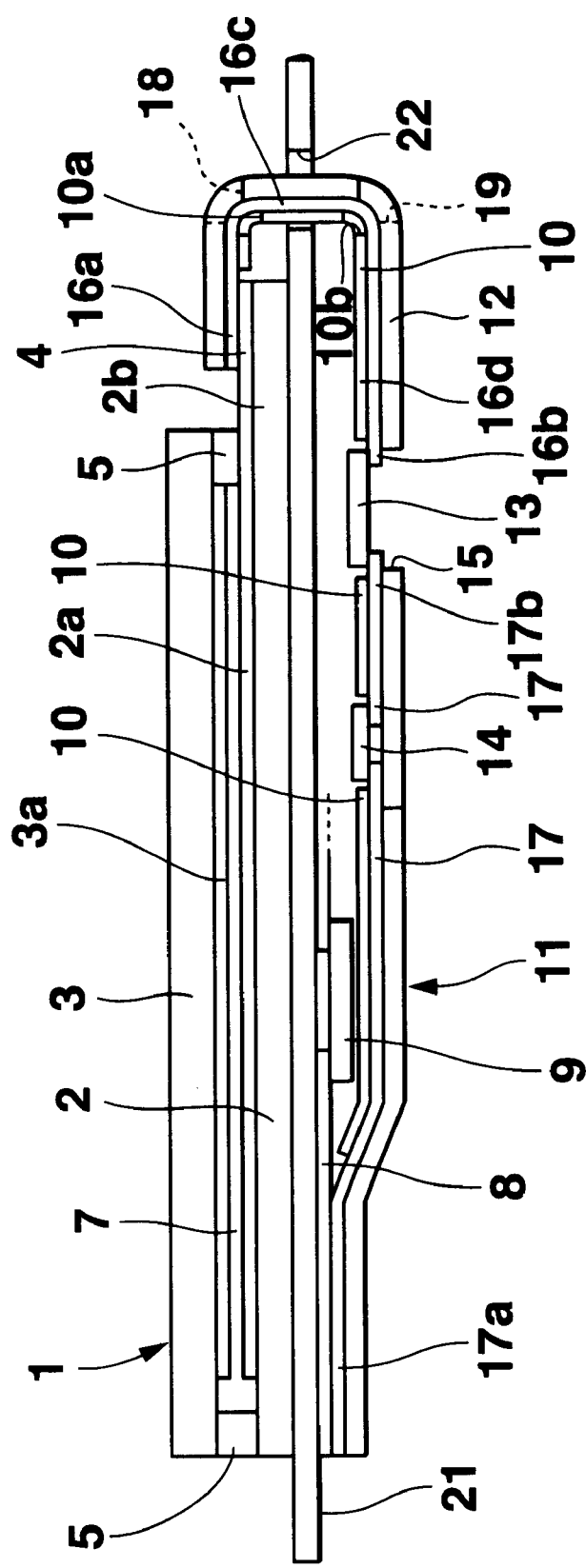
FIG. 14 is a side view for explaining as an example the state that the conventional liquid crystal display module is mounted to a circuit board.

As described above, the flexible wiring board 41 is bent in substantially a U-shape in the arranging region of the drawing wirings 45c. It should be noted in this connection that the film substrate 42 was made thin, i.e., the thickness of the film substrate 42 was not smaller than 10 $\mu$m and smaller than 40 $\mu$m, and the semiconductor chip was heated. Further, pressure was applied under heat with a bonding tool brought into direct contact with the other surface of the film substrate 42 so as to obtain the flexible wiring board 41 in which the bump electrode was bonded to the connection terminal with a high reliability. Since the flexible wiring board 41 is constructed by the film substrate 42 formed of a polyimide film having a thickness not smaller than 10 $\mu$m and smaller than 40 $\mu$m, the flexible wiring board 41 is excellent in flexibility so as to be bent optionally unlike the case where the film substrate 42 is formed of a polyimide film having a thickness of about 75 $\mu$m to 150 $\mu$m. What should be noted is that the film substrate 42 itself can be bent moderately and uniformly in substantially a U-shape by applying a slight stress, though the film substrate 42 is not provided with any slit. In other words, the flexible wiring board 41 can be bent easily in even the arranging region of the drawing wirings 45c including the inclined wiring sections 45d without forming a slit in the film substrate 42. As a result, the drawing wirings in the portion corresponding to the drawing wiring section 16c between the conventional slits 18 and 19 (FIG. 12) and in the portion corresponding to the slits 18 and 19 is rendered unnecessary, making it possible to set the output wiring 45 short. It follows that it is possible to shorten the length in the extending direction of the output wiring 45, i.e., in the vertical direction in the upper portion in FIG. 1 of the mounting region of the semiconductor chip. As a result, the flexible wiring board 41 can be miniaturized while maintaining a good connection and can be made excellent in the mounting capability with a high mounting density. Further, the manufacturing cost can be lowered.

Figure 5:
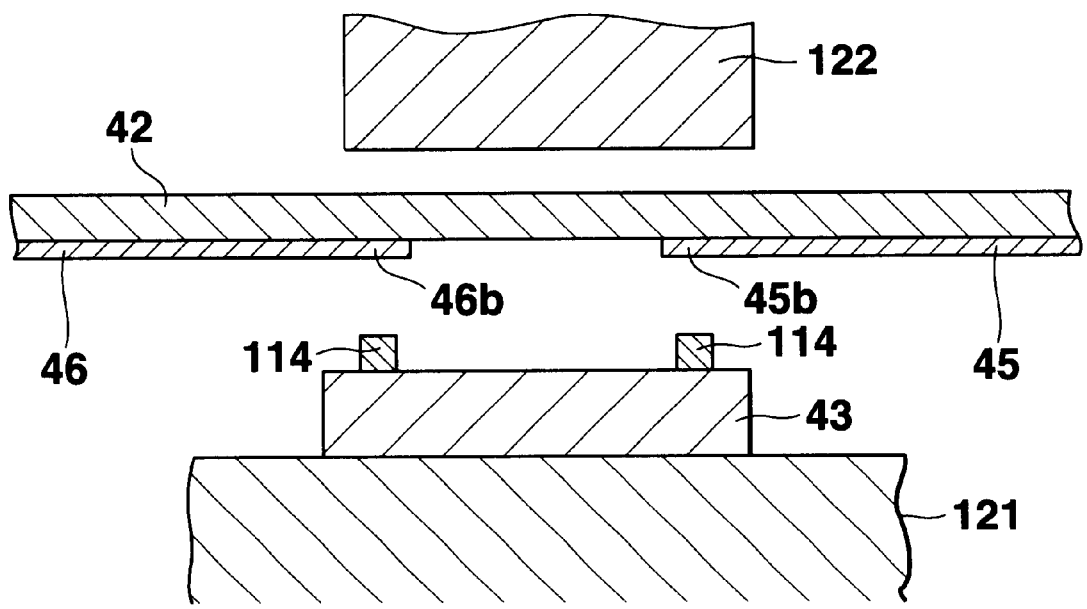
FIG. 5 is a cross sectional view for explaining the step of moving a flexible wiring board to a region above the semiconductor chip.

How to bond the semiconductor chip 43 onto the flexible wiring board 41 will now be described. In the first step, prepared is a bonding apparatus as shown in FIG. 5. The bonding apparatus comprises a stage 121 having a heater (not shown) housed therein and a bonding tool 122 arranged vertically movable above the stage 121. The semiconductor chip 43 is mounted on the stage 121 with the bump electrodes 114 facing upward. Also, the film substrate 42, which has lower and upper surfaces, facing the semiconductor chip 43 over the entire region of the mounting region of the semiconductor chip is arranged above the semiconductor chip 43 such that the lower surface of the film substrate 42 on which the wirings 45 and 46 are formed faces the semiconductor chip 43. Then, the bump electrodes 114 of the semiconductor chip 43 are aligned with the connection terminals 45b, 46b on the film substrate 42.

Figure 6:
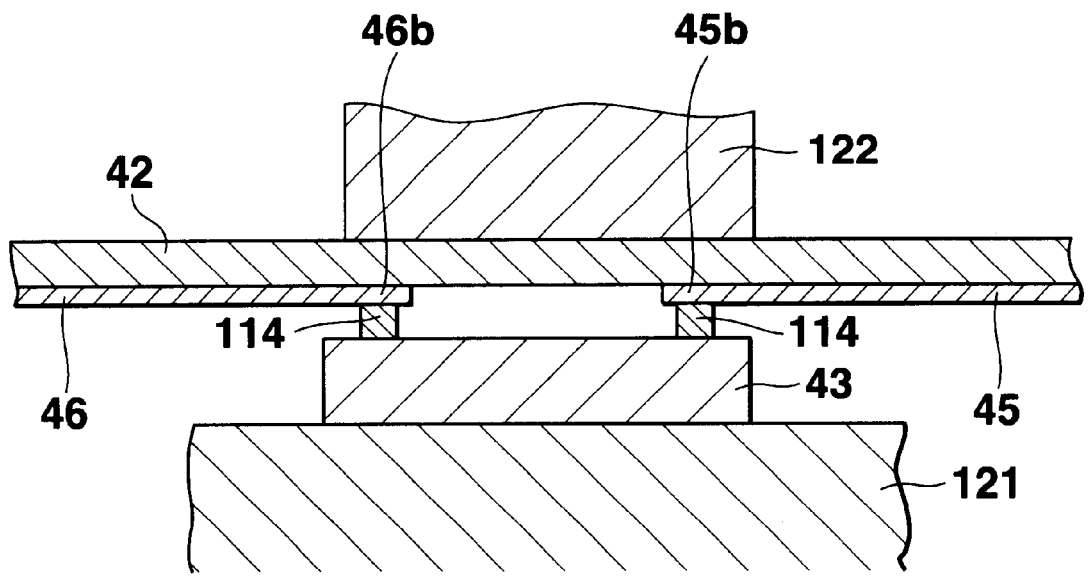
FIG. 6 is a cross sectional view for explaining the step of bonding the flexible wiring board to the semiconductor chip.

In the next step, for example, the stage 121 is moved upward so as to bring the bump electrodes 114 into contact with the connection terminals 45b, 46b, as shown in FIG. 6. Also, the bonding tool 122 is moved downward. Under this state, the stage 121 is heated to 350° C. to 450° C., preferably about 400° C., so as to heat the semiconductor chip 43. Also, the bonding tool 122 is heated to 250° C. to 350° C., preferably about 300° C., and the bonding tool 122 is brought into direct contact with the upper surface of the film substrate 42 so as to press the upper surface of the film substrate 42. The bump electrodes 114 are kept pressurized under heat for 1 to 3 seconds against the connection terminals 45b, 46b mounted to the film substrate 42.

As described above, since the film substrate 42 is very thin, i.e., the thickness is not smaller than 10 μm and smaller than 40 μm, the heat applied to the film substrate 42 is promptly transmitted to the connection terminals 45b, 46b so as to heat the film substrate 42 with a relatively low temperature and for a short time. It follows that the thermal deformation does not take place in the film substrate 42. Further, since the stage 121 heats the semiconductor chip 43, the bump electrodes and the connection terminals 45b, 46b are heated from both above and below. As a result, the temperature required for the bonding is reached promptly even under a relatively low temperature, making it possible to obtain bonding of a high reliability. In the flexible wiring board 41 thus bonded, a device hole is not formed in the mounting region of the semiconductor chip of the film substrate 42, unlike the prior art. Therefore, the connection terminals 45b, 46b formed on the film substrate 42 are unlikely to be deformed before and after the bonding. It follows that an inconvenience such as a defective bonding between the connection terminals 45a, 45b and the bump electrodes 114 does not take place, leading to the effect of improving the production efficiency. Further, since the wirings 45 and 46 are bonded to the film substrate 42 without interposing an adhesive, it is impossible for the adhesive to be melted in the bonding step so as to deviate the positions of the connection terminals 45b and 46b, making it possible to achieve the bonding with a high accuracy.

Figure 7:
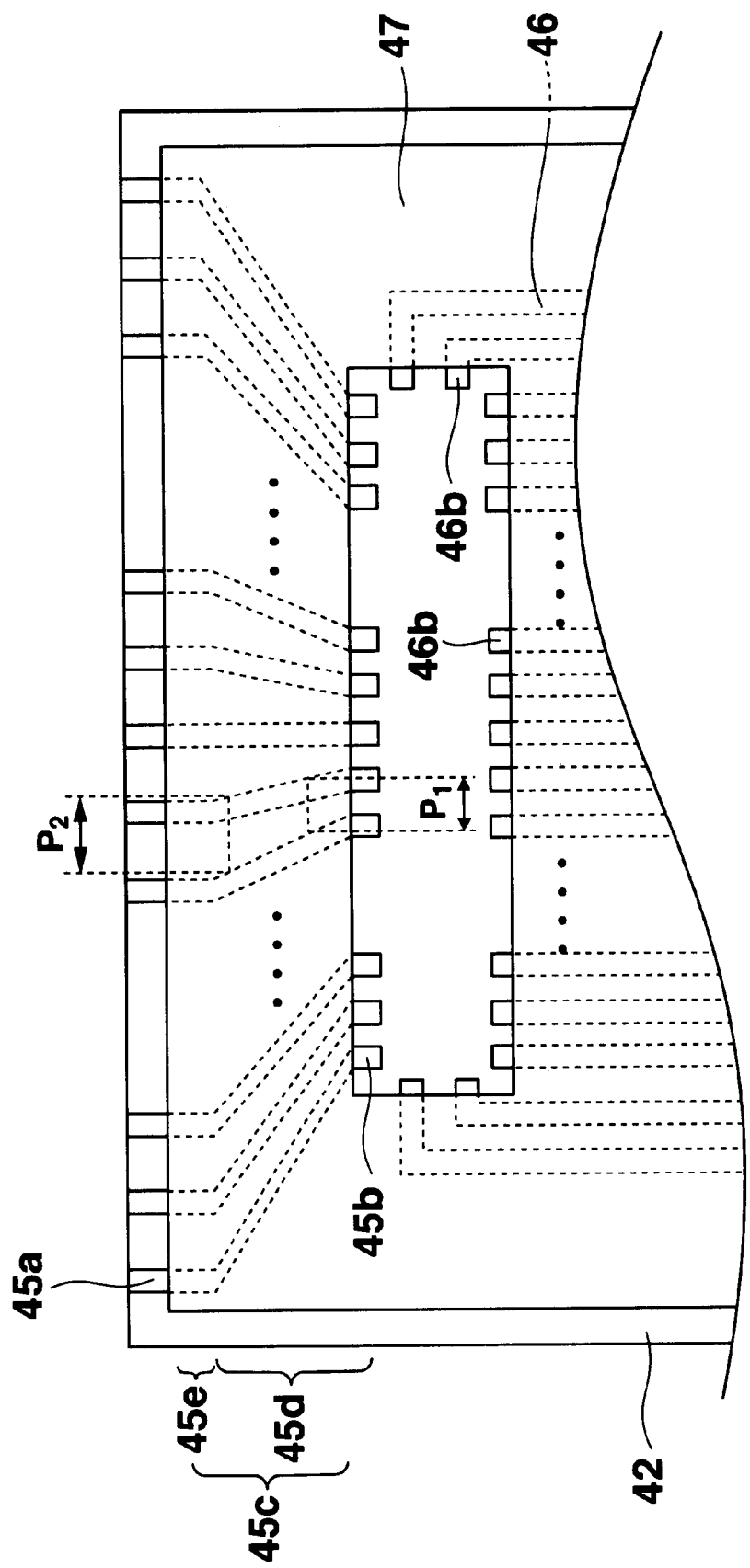
FIG. 7 is a plan view showing the wiring structure of a flexible wiring board of a liquid crystal display module according to a second embodiment of the present invention.

FIG. 7 is a plan view showing a liquid crystal display module according to a second embodiment of the present invention. The liquid crystal display module in the second embodiment is substantially equal to the liquid crystal display module according to the first embodiment of the present invention described above except the arrangements of the output wiring 45 and the input wiring 46 of the flexible wiring board 41.

In the flexible wiring board 41 according to the first embodiment described above, the second connection terminals 46b of the input wiring 46 are arranged on one side in the longitudinal direction of the rectangular semiconductor chip 43 in the positions facing the bump electrodes, and the second connection terminals 45b of the output wiring 45 are arranged on the other three sides, i.e., the other side on the longitudinal direction and on the two short sides on the both edges of the semiconductor chip in the positions facing the bump electrodes. In the flexible wiring board 41 according to the second embodiment of the present invention, however, the second connection terminals 46b of the input wiring 46 are arranged on one side in the longitudinal direction of the rectangular semiconductor chip 43 and on the two short sides at both edges of the semiconductor chip 43 in the positions facing the bump electrodes, and the second connection terminals 45b of the output wiring 45 are arranged on the other side in the longitudinal direction of the semiconductor chip 43 in the positions facing the bump electrodes.

Therefore, in the second embodiment of the present invention, the distance between the adjacent first connection terminals 45a can be designed longer than the distance between the adjacent second connection terminals 45b.

The output wiring 45 comprises the first connection terminals 45a that are not covered with the protective film 47 so as to be exposed to the upper edge portion in FIG. 7, the second connection terminals 45b arranged in parallel in a predetermined position in the mounting region of the semiconductor chip and in a region in the vicinity of said predetermined position, and the drawing wirings 45c extending between the second connection terminals 45b and the first connection terminals 45a.

As shown in FIG. 7, the drawing wirings 45c in the second embodiment of the present invention comprise the inclined wiring sections 45d arranged such that the arranging pitch is gradually increased from the second connection terminals 45b toward the first connection terminals 45a, and the parallel wiring sections 45e arranged in parallel. In other words, the inclined wiring sections 45d in the adjacent drawing wirings 45c are set such that the pitch $P_2$ on the side of the first connection terminals 45a is made longer than the pitch $P_1$ on the side of the second connection terminals 45b. On the other hand, that portions of the input wiring 46 which is not covered with the protective film 47 so as to be exposed to the lower end portion in FIG. 1 constitute the first connection terminals 46a, and the portions in the mounting region of the semiconductor chip constitute the second connection terminals 46b.

As described above, in the liquid crystal module of the wiring structure described above, the inclined wiring sections 45d and the parallel wiring sections 45e are readily bent so as to permit the flexible wiring board 41 to allow the film substrate 42 to be bent in a U-shape as shown in FIG. 4, thereby making it possible to permit the film substrate 42 to have a short structure.

In the second embodiment described above, each drawing wiring section 45c comprises both the inclined wiring section 45d and the parallel wiring section 45e. However, it is also possible for the drawing wiring section 45c to constitute the inclined wiring section 45d alone. It is also possible for the drawing wiring section 45c, which comprises the inclined wiring section 45d and the parallel wiring section 45e, to include further a second parallel wiring section consisting of a plurality of wirings arranged in parallel like the parallel wiring section 45e, said second parallel wiring section being arranged between the inclined wiring section 45d and the second connection terminals 45d. Alternatively, even if the drawing wiring 45c is formed by only the second parallel wiring section and the inclined wiring section 45d, it is possible to obtain the similar effect as far as the bent portion includes the inclined wiring section 45d.

Figure 8:
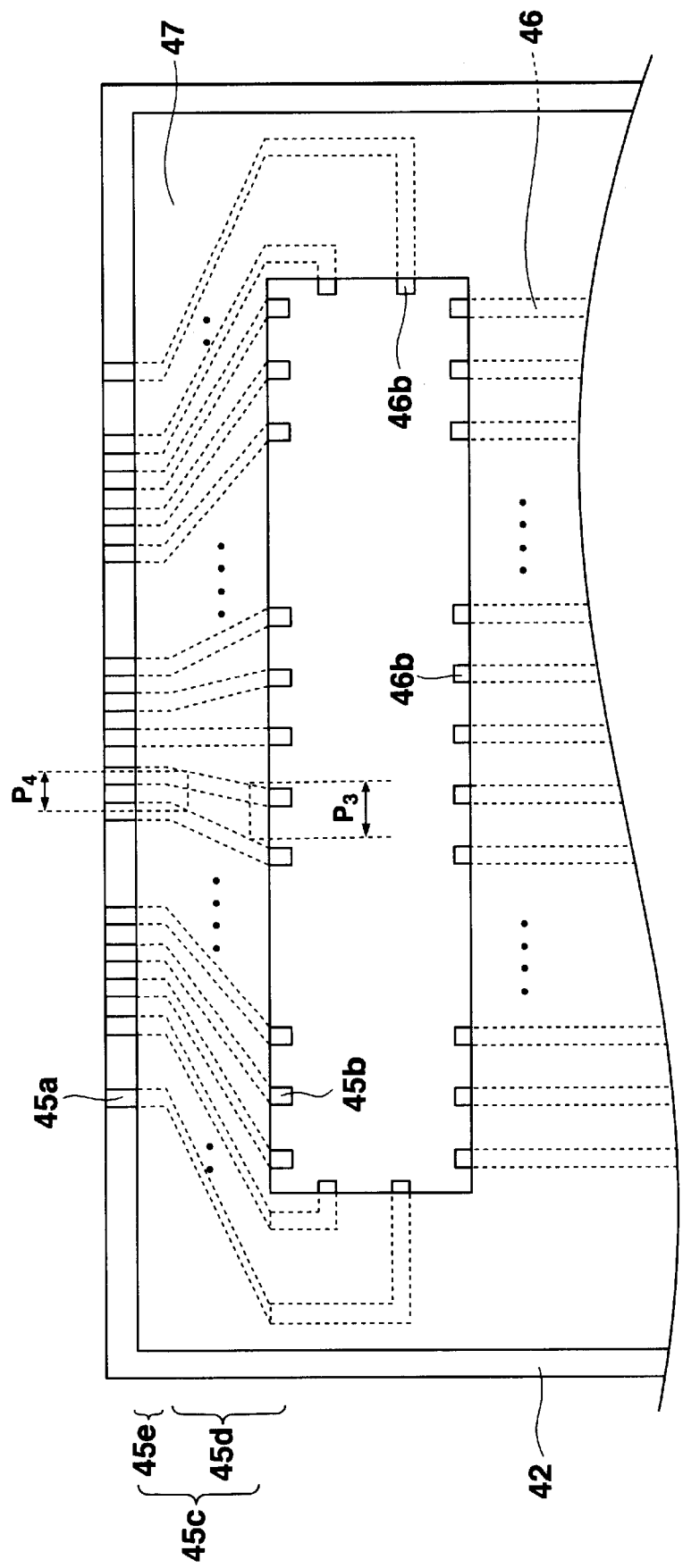
FIG. 8 is a plan view showing the wiring structure of a flexible wiring board of a liquid crystal display module according to a third embodiment of the present invention.

FIG. 8 is a plan view showing a liquid crystal module according to a third embodiment of the present invention. The liquid crystal display module according to the third embodiment is substantially equal to the liquid crystal display module according to the first embodiment described previously except the arrangements of the output wiring 45 and the input wiring 46 of the flexible wiring board 41.

In the flexible wiring board 41 according to the third embodiment of the present invention, the second connection terminals 46b of the input wiring 46 are arranged on one side in the longitudinal direction of a rectangular semiconductor chip 43 in positions facing the bump electrodes, and the second connection terminals 45b of the output wiring 45 are positioned on the other three sides of the semiconductor chip 43 in the positions facing the bump electrodes, as in the first embodiment. Therefore, since the number of first connection terminals concentrated on one side of the film substrate 42 corresponds to the number of bump electrodes on the three sides of the semiconductor chip 43, the distance between the adjacent first connection terminals 45a is required to be shorter than the distance between the adjacent connection terminals 45b.

The drawing wiring section 45c are formed by the inclined wiring sections 45d arranged such that the arranging pitch of the inclined wiring sections 45d is gradually diminished from the side of the second connection terminal 45b toward the first connection terminal 45a, and the parallel wiring sections 45e arranged in parallel. In other words, the pitch $P_3$ of the adjacent inclined wiring sections 45d on the side of the second connection terminal 45b is set longer than the pitch $P_4$ on the side of the first connection terminal 45a. Since the inclined wiring sections 45d are inclined and thus concentrated in a central portion on one side on the side of the first connection terminals 45a in a manner to make shorter the distance between the adjacent first connection terminals 45a, the inclined wiring section 45d is shorter in a region closer to the center of one side of the film substrate 42 and is longer in regions closer to both ends of one side of the film substrate 42.

The wiring sections 45e, which are parallel to each other, of the output wiring 45 are positioned closer to the first connection terminals 45a than to the inclined wiring sections 45d, and the length of each of the parallel wiring sections 45e is set at a predetermined value, though it is not absolutely necessary for the lengths of the parallel wiring sections 45e to be set at predetermined values.

In the liquid crystal module of the wiring structure described above, the inclined wiring section 45d and the parallel wiring section 45e can be bent easily so as to permit the flexible wiring board 41 to be bent together with the film substrate 42 in a substantial U-shape as shown in FIG. 4, thereby allowing the film substrate 42 to be of a short structure.

In the third embodiment described above, the drawing wiring section 45c is formed by the inclined wiring section 45d and the parallel wiring section 45e. Alternatively, it is possible for the drawing wiring section 45c to consist of the inclined wiring section 45d alone. In this case, the inclined wiring section 45d is bent so as to produce the effect described above. It is also possible for the drawing wiring section 45c, which is formed by the inclined wiring section 45d and the parallel wiring section 45e, to include further a second parallel wiring section consisting of a plurality of wirings arranged in parallel like the parallel wiring section 45e. The second parallel wiring sections are arranged between the inclined wiring sections 45d and the second connection terminals 45d. Alternatively, even if the drawing wiring 45c is formed by only the second parallel wiring section and the inclined wiring section 45d, it is possible to obtain the similar effect as far as the bent portion includes the inclined wiring section 45d.

In each of the first to third embodiments of the present invention described above, the thickness of the film substrate 42 may be defined to be not smaller than 10 μm and to be smaller than 40 μm. However, it is more desirable for the thickness of the film substrate 42 to be not smaller than 20 μm and to be smaller than 40 μm in view of the case where the film substrate is transferred as a carrier tape having sprocket holes formed on both sides of the film substrate.

In each of the first to third embodiments of the present invention described above, a liquid crystal display panel is used as the display panel. However, the technical idea of the present invention can also be applied to the cases where an electroluminescence element, which is a spontaneous light emitting element, a plasma display or a field emission display is used as the display panel.

When it comes to the semiconductor device shown in FIG. 3, the semiconductor chip 43 is bonded with the film substrate 42 kept flat. In this case, the distance between output and input the wirings 45, 46 and the edge on the upper surface of the semiconductor chip 43 is small. Therefore, where there is a small burr in the edge or if the film substrate 42 is deformed in the bonding step, short-circuiting tends to be brought about between the edge on the upper surface of the semiconductor chip 43 and the wirings 45, 46 on the film substrate 42.

Such being the situation, it is important to prevent the short circuit between the edge on the upper surface of the semiconductor chip 43 and the wirings 45, 46 of the film substrate 42. A flexible wiring board according to a fourth embodiment of the present invention will now be described with reference to FIG. 9. In the wiring board according to the fourth embodiment of the present invention, the film substrate 42 in the vicinity of the connection terminals 45b, 46b bonded to the bump electrodes 114 and in the portion corresponding to said vicinity is deformed so as to permit the film substrate 42 to be positioned apart from the upper surface of the semiconductor chip 43. It follows that it is possible to prevent the short circuit between the edge on the upper surface of the semiconductor chip 43 and the wirings 45, 46 of the film substrate 42.

Figure 10:
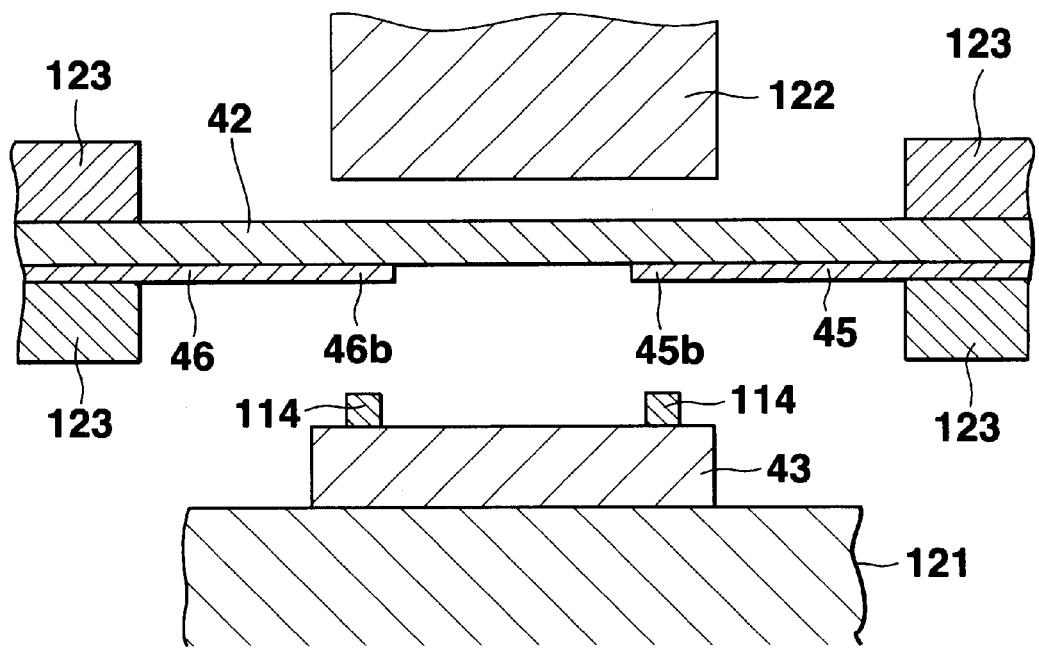
FIG. 10 is a cross sectional view for explaining the step of moving the flexible wiring board according to the fourth embodiment of the present invention to a region above the semiconductor chip.

A method of manufacturing the flexible wiring board of the present embodiment will now be described with reference to FIGS. 10 and 11. In the first step, the bonding apparatus as shown in FIG. 10 is prepared. The bonding apparatus comprises the stage 121 having a heater (not shown) arranged therein, and the bonding tool 122 arranged movable in a vertical direction above the stage 121. Further, a clamp 123 is arranged to surround the bonding tool 122 above the stage 121. The semiconductor chip 43 is disposed on the stage 121, and that portion of the film substrate 42 surrounding a region in which the semiconductor chip 43 is disposed is held by the clamp 123. Under this state, the distance between the connection terminals 45b, 46b and the bump electrodes 114 is set at, for example, about 200 μm.

Figure 9:
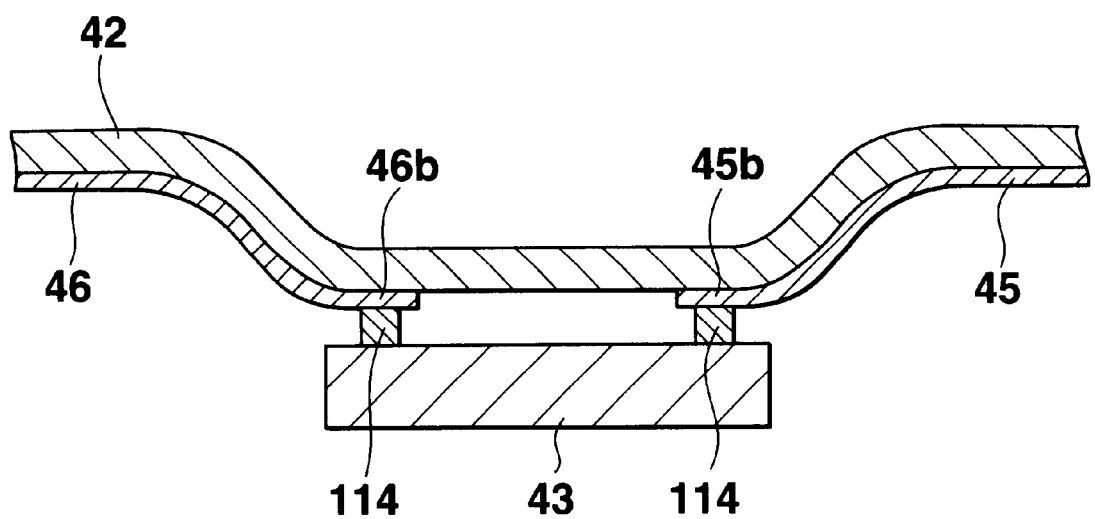
FIG. 9 is a cross sectional view showing a portion of a flexible wiring board according to a fourth embodiment of the present invention.
Figure 11:
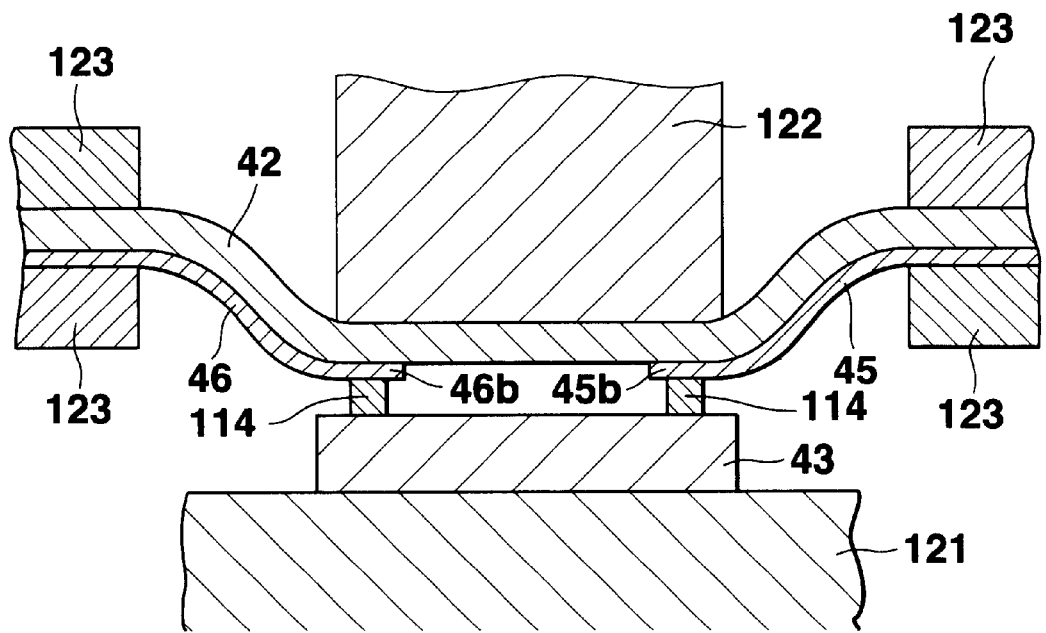
FIG. 11 is a cross sectional view for explaining the step of bonding the flexible wiring board according to the fourth embodiment of the present invention to a semiconductor chip.

Then, the bonding tool 122 is moved downward as shown in FIG. 11 so as to permit the lower surface of the bonding tool 122 to push a region of the upper surface of the film substrate 42 corresponding to the connection terminals 45b and 46b and a portion inside the terminals. As a result, the film substrate 42 is partially deformed downward appropriately in the vicinity of the portions where the connection terminals 45b and 46b are bonded to the bump electrodes 114 and in the portion corresponding to said vicinity. Under this state, the bump electrodes 114 are bonded to the connection terminals 45b and 46b, respectively. In this case, the heating temperature of the bonding tool 122 is set at 250 to 350° C., preferably about 300° C., and the heating temperature of the stage 121 is set higher than the heating temperature of the bonding tool 122. To be more specific, the heating temperature of the stage 121 is set at 350 to 450° C., preferably about 400° C., and the bonding time is set at about 1 to 3 seconds. As a result, the wiring board as shown in FIG. 9 can be obtained.

In the manufacturing method described above, the film substrate 42 in the vicinity of the regions where the connection terminals 45b, 46b are bonded to the bump electrodes 114 and in the portion corresponding to said vicinity is deformed to be positioned apart from the upper surface of the semiconductor chip 43 simultaneously with the mounting of the semiconductor chip 43 to the lower surface of the film substrate 42. In other words, since the connection terminals 45b, 46b are formed to include inclined regions positioned to be gradually apart from the semiconductor chip 43 together with the film substrate 42 from the portions bonded to the bump electrodes 114 toward the outside of the mounting region of the semiconductor chip, it is possible to prevent the number of manufacturing steps from being increased.

Another example of a method of manufacturing the flexible wiring board shown in FIG. 9 will now be described. In this example, the semiconductor chip 43 is mounted first on the lower surface of the film substrate 42 as shown in FIG. 6. Then, that region of the film substrate 42 in which the semiconductor chip 43 is held by the clamp 123 as shown in FIGS. 10 and 11, followed by moving downward the bonding tool 122 so as to deform the film substrate 42 in the regions in which the connection terminals 45b, 46b are bonded to the bump electrodes 114 and in the portion corresponding to said vicinity so as to permit the particular portions of the film substrate 42 to be positioned apart from the semiconductor chip 43.

As described above, in the present invention, a bonding tool is brought into direct contact with the other surface of the film substrate under certain conditions with the semiconductor chip kept heated so as to pressurize the semiconductor chip under heat and, thus, to obtain the bonding of a high reliability, even where the film substrate has one surface corresponding to one surface of the semiconductor chip over the entire mounting region of the semiconductor chip and other surfaces. What should also be noted is that, since a device hole is not formed in the semiconductor chip mounting region of the film substrate, it is possible to prevent the connection terminals mounted to the film substrate from being deformed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method comprising:

heating a first surface of a semiconductor chip by disposing the semiconductor chip on a stage heated to a temperature of 350° C. to 450° C.;

aligning a plurality of metallic bump electrodes arranged on a second surface of the semiconductor chip with a plurality of connection terminals formed on a first surface of a flexible wiring board, wherein the flexible wiring board comprises a polyimide film having a thickness from 10 $\mu$m to 40 $\mu$m; and applying pressure to the flexible wiring board for bonding the plural bump electrodes to the plural connection terminals while heating a second surface of the flexible wiring board with a bonding tool heated to a temperature of 250° C. to 350° C.

2. The method according to claim 1, wherein during bonding of the plural bump electrodes to the plural connection terminals, the flexible wiring board is bent due to the pressure applied thereto so that a region in a vicinity of the plural connection terminals is projected.

3. A method comprising:

heating a first surface of a semiconductor chip;

aligning a plurality of metallic bump electrodes arranged on a second surface of the semiconductor chip with a plurality of connection terminals formed on a first surface of a flexible wiring board; and applying pressure to bond the plural bump electrodes to the plural connection terminals and to bend the flexible wiring board so that a region in a vicinity of the plural connection terminals is projected while heating a second surface of the flexible wiring board.

4. The method according to claim 3, wherein the flexible wiring board comprises a polyimide film having a thickness from 10 $\mu$m to 40 $\mu$m.

5. The method according to claim 3, wherein during bonding of the plural bump electrodes to the plural connection terminals, the second surface of the flexible wiring board is pressurized by a bonding tool heated to a temperature of 250° C. to 350° C.

6. The method according to claim 3, wherein the first surface of the semiconductor chip is heated by disposing the semiconductor chip on a stage heated to a temperature of 350° C. to 450° C.

7. The method of manufacturing a flexible wiring board according to claim 3, wherein during bonding of the plural bump electrodes to the plural connection terminals, the flexible wiring board is held by a clamp.

* * * * *